United States Patent
Leon et al.

(10) Patent No.: US 6,838,226 B2
(45) Date of Patent: Jan. 4, 2005

(54) IMAGING MEMBER WITH MICROGEL PROTECTIVE LAYER

(75) Inventors: Jeffrey W. Leon, Rochester, NY (US); David B. Bailey, Webster, NY (US)

(73) Assignee: Eastman Kodak Company, Rochester, NY (US)

(*) Notice: Subject to any disclaimer, the term of this patent is extended or adjusted under 35 U.S.C. 154(b) by 0 days.

(21) Appl. No.: 10/441,715

(22) Filed: May 20, 2003

(65) Prior Publication Data

US 2004/0234891 A1 Nov. 25, 2004

(51) Int. Cl.$^7$ .......................... G03F 01/04; G03C 01/76
(52) U.S. Cl. .............................. 430/273.1; 430/271.1; 430/525
(58) Field of Search .................... 430/273.1, 271.1, 430/525

(56) References Cited

U.S. PATENT DOCUMENTS

| | | | | |
|---|---|---|---|---|
| 4,539,348 A | * | 9/1985 | Gajria et al. | 523/409 |
| 4,546,014 A | * | 10/1985 | Gajria et al. | 427/239 |
| 4,560,714 A | * | 12/1985 | Gajria et al. | 523/409 |
| 5,506,090 A | | 4/1996 | Gardner, Jr. | 89/25.35 |
| 5,786,127 A | | 7/1998 | Madoux et al. | 430/273.1 |
| 6,165,653 A | * | 12/2000 | Yau et al. | 430/14 |
| 6,214,938 B1 | * | 4/2001 | Yau et al. | 525/209 |
| 6,397,749 B1 | | 6/2002 | Kita et al. | 101/457 |
| 6,506,527 B1 | * | 1/2003 | Demejo et al. | 430/14 |

FOREIGN PATENT DOCUMENTS

| | | |
|---|---|---|
| EP | 0 855 267 A2 | 7/1998 |
| EP | 1 031 412 A1 | 8/2000 |
| EP | 0 816 070 B1 | 10/2000 |
| EP | 1 106 347 A1 | 6/2001 |
| EP | 1 147 886 A2 | 10/2001 |
| JP | 2001-162961 | 6/2001 |
| JP | 2001-162963 | 6/2001 |
| JP | 2001-253179 | 9/2001 |
| JP | 2001-334763 | 12/2001 |
| JP | 2001-347768 | 12/2001 |
| JP | 2002-029166 | 1/2002 |
| JP | 2002-086946 | 3/2002 |
| JP | 2002-086949 | 3/2002 |

\* cited by examiner

*Primary Examiner*—Hoa Van Le
(74) *Attorney, Agent, or Firm*—J. Lanny Tucker

(57) ABSTRACT

Various imaging members including lithographic imaging members (such as printing plates) have an aqueous-based imaging layer applied to a support. Directly over the imaging layer is a protective layer that is applied as a non-aqueous inverse emulsion comprising highly hydrophilic, water-swellable microgel particles dispersed in a water-immiscible organic solvent. This protective layer provides physical durability but it is still readily removed during or after imaging with water or fountain solutions.

26 Claims, No Drawings

IMAGING MEMBER WITH MICROGEL PROTECTIVE LAYER

CROSS REFERENCE TO RELATED APPLICATION

Reference is made to copending and commonly assigned U.S. Ser. No. 10/441550 filed on even date herewith by Leon and Bailey and entitled "METHOD OF PREPARING IMAGING MEMBER WITH MICROGEL PROTECTIVE LAYER" (Attorney Docket 85522/JLT).

FIELD OF THE INVENTION

This invention relates to an imaging member that includes a unique protective layer disposed over an imaging layer. In particular, the invention relates to lithographic printing plates containing a unique protective layer wherein the imaging layer and protective layer can be applied out of different solvent systems.

BACKGROUND OF THE INVENTION

The art of lithographic printing is based upon the immiscibility of oil and water, wherein an oily material or ink is preferentially retained by an imaged area and the water or fountain solution is preferentially retained by the non-imaged areas. When a suitably prepared surface is moistened with water and ink is then applied, the background or non-imaged areas retain the water and repel the ink while the imaged areas accept the ink and repel the water. The ink is then transferred to the surface of a suitable substrate, such as cloth, paper or metal, thereby reproducing the image.

Very common lithographic printing plates include a metal or polymer support having thereon a suitable imaging layer, for example a layer that is sensitive to visible or UV light. Both positive- and negative-working printing plates can be prepared in this fashion. Upon exposure, and perhaps post-exposure heating, either imaged or non-imaged areas are removed using wet processing chemistries.

Thermally sensitive printing plates are becoming more common. Examples of such plates are described in U.S. Pat. No. 5,372,915. (Haley et al.). They include an imaging layer comprising a mixture of dissolvable polymers and an infrared radiation-absorbing compound.

It has been recognized that a lithographic printing plate also could be created by ablating an IR absorbing layer. For example, Canadian Patent 1,050,805 (Eames) discloses a dry planographic printing plate comprising an ink receptive substrate, an overlying silicone rubber layer, and an interposed layer comprised of laser energy absorbing particles (such as carbon particles) in a self-oxidizing binder (such as nitrocellulose). Such plates were exposed to focused near IR radiation with a Nd$^{++}$YAG laser. The absorbing layer converted the infrared energy to heat thus partially loosening, vaporizing or ablating the absorber layer and the overlying silicone rubber. Similar plates are described in *Research Disclosure* 19201, 1980 as having vacuum-evaporated metal layers to absorb laser radiation in order to facilitate the removal of a silicone rubber overcoated layer. These plates were developed by wetting with hexane and rubbing. Other publications describing "ablatable" printing plates include U.S. Pat. No. 5,385,092 (Lewis et al.), U.S. Pat. No. 5,339,737 (Lewis et al.), U.S. Pat. No. 5,353,705 (Lewis et al.), U.S. Reissued Pat. No. 35,512 (Nowak et al.), and U.S. Pat. No. 5,378,580 (Leenders).

Thermally switchable polymers have been described for use as imaging materials in printing plates. By "switchable" is meant that the polymer is rendered from hydrophobic to relatively more hydrophilic or, conversely from hydrophilic to relatively more hydrophobic, upon exposure to heat.

U.S. Pat. No. 4,034,183 (Uhlig) describes the use of high-powered lasers to convert hydrophilic surface layers to hydrophobic surfaces. A similar process is described for converting polyamic acids into polyimides in U.S. Pat. No. 4,081,572 (Pacansky). U.S. Pat. No. 4,634,659 (Esumi et al.) describes imagewise irradiating hydrophobic polymer coatings to render exposed regions more hydrophilic in nature. U.S. Pat. No. 4,405,705 (Etoh et al.) and U.S. Pat. No. 4,548,893 (Lee et al.) describe amine-containing polymers for photosensitive materials used in non-thermal processes. Thermal processes using polyamic acids and vinyl polymers with pendant quaternary ammonium groups are described in U.S. Pat. No. 4,693,958 (Schwartz et al.). U.S. Pat. No. 5,512,418 (Ma) describes the use of polymers having heat-sensitive cationic quaternary ammonium groups. However, the materials described in this art require wet processing after imaging.

In addition, EP 0 652 483A1 (Ellis et al.) describes lithographic printing plates imageable using IR lasers, and which do not require wet processing. These plates comprise an imaging layer that becomes more hydrophilic upon imagewise exposure to heat.

U.S. Pat. No. 5,985,514 (Zheng at al.) is directed to processless direct write printing plates that include an imaging layer containing heat sensitive polymers. The polymer coatings are sensitized to infrared radiation by the incorporation of an infrared absorbing material such as an organic dye or a fine dispersion of carbon black. Upon exposure to a high intensity infrared laser, light absorbed by the organic dye or carbon black is converted to heat, thereby promoting a physical change in the polymer (usually a change in hydrophilicity or hydrophobicity). The resulting printing plates can be used on conventional printing presses to provide, for example, negative images. Such printing plates have utility in the evolving "computer-to-plate" printing market.

Other imaging materials comprising heat-sensitive polymers are described, for example, in U.S. Pat. No. 6,190,830. (Leon et al.), U.S. Pat. No. 6,190,831 (Leon et al.), and U.S. Pat. No. 6,096,471 (Van Damme et al.).

Generally, printing plates comprise an imaging layer and an outermost protective layer to provide protection from contamination, fingerprints, and debris resulting from handling and imaging. For example, aqueous-based overcoats that may be partially crosslinked are described in JP Kokai 2002-86949 (Fuji Photo).

As noted from the literature relating to this technology, it is preferable to apply a protective layer to an imaging layer out of a predominantly aqueous solvent system so as to enable removal during imaging or post-imaging processing. For example, U.S. Pat. No. 5,506,090 (Gardner Jr. et al.) describes processless printing plates that have a protective top coat prepared from a film-forming water-soluble or -dispersible polymer that can be removed using a fountain solution.

Protective layers may also be disposed over "ablatable" imaging layers in printing plates as described for example in U.S. Pat. No. 6,397,749 (Kita et al.). Water-soluble or water-swellable polymers are used in protective layers over thermoplastic particle imaging layers described in EP 816 070B1 (Vermeersch et al.) and EP 1 106 347A1 (Kita et al.).

However, when an aqueous formulation is used to apply such layers over imaging layers also applied from aqueous solvent systems, the two formulations are likely to mix at the layer interface. This results in unwanted diffusion of components from one layer to another, or unwanted adhesion of a topcoat to an underlying layer such that the removal of the topcoat (which may be desired in a later step in a process) may not completely occur or may leave behind a contaminated or otherwise damaged surface.

Thus, there is a need in the industry for imaging members prepared from aqueous imaging layer formulations and suitable organic solvent-based protective layer formulations that have discrete layers during coating and drying procedures. It is also desirable that the protective layer be readily removable using an aqueous solvent system during imaging and/or post-imaging development without limiting the type of imaging layer or imaging techniques that can be employed.

SUMMARY OF THE INVENTION

The present invention provides an advance in the art with an imaging member comprising a support, and disposed thereon:

an imaging layer comprising one or more imaging components, which layer has been applied as an aqueous formulation, and applied directly over the imaging layer, a protective layer comprising highly hydrophilic, water-swellable microgel particles that have been applied as a non-aqueous inverse emulsion dispersed in a water-immiscible organic solvent.

In preferred embodiments, the present invention provides a lithographic imaging member comprising a support, and disposed thereon:

a lithographic imaging layer that has been applied as an aqueous formulation, and applied directly over the lithographic imaging layer, a protective layer comprising highly hydrophilic, water-swellable microgel particles that have been applied as a non-aqueous inverse emulsion dispersed in a water-immiscible organic solvent.

In method of imaging of the present invention comprises:

A) providing the lithographic imaging member of the present invention, and

B) imagewise exposing the lithographic imaging member to thermal energy to provide exposed and unexposed areas in the lithographic imaging layer to provide a lithographic printing plate.

A method of printing of the present invention comprises:

A) providing the lithographic imaging member of the present invention,

B) imagewise exposing the lithographic imaging member to thermal energy to provide exposed and unexposed areas in the imaging layer to provide a lithographic printing plate, and C) in the presence of water or a fountain solution, contacting the lithographic printing plate with a lithographic printing ink, and imagewise transferring the lithographic printing ink to a receiving material.

The present invention provides a number of advantages over known methods for preparing multilayer imaging members. In particular, it provides imaging members that can be readily prepared by applying formulations in organic solvents over aqueous-based imaging layer formulations so that a blending of the layers is minimized or avoided entirely. The overcoated layers can be used as protective layers because of their physical durability but they are still readily removed during or after imaging with water or aqueous processing solutions.

These advantages are possible because the overcoated layer is provided from a non-aqueous inverse emulsion comprising highly hydrophilic, water-swellable (preferably crosslinked) microgel particles. This emulsion is dispersed in and coated out of water-immiscible organic solvents, and upon drying provides a physical durable layer. However, it can be removed, imagewise or entirely, by application of water or an aqueous solvent.

DETAILED DESCRIPTION OF THE INVENTION

The present invention provides imaging members with two or more layers disposed on a suitable support. By "imaging member", we mean any element or article that has one or more layers containing suitable image-forming chemistry and that can be used to provide a suitable photographic, thermographic, photothermographic, electrographic, electrophotographic, lithographic, or inkjet images. The types of imaging chemistries needed for such imaging members will not be discussed in detail because they are well known. For example, photographic imaging layer compositions (or emulsions) are well known for both color and black-and-white photographic materials and are described for example in *Research Disclosure* 38957, pp. 592–639 (September 1996) and the hundreds of publications noted therein, all of which are incorporated herein by reference. Thermally sensitive imaging compositions (or emulsions) for both thermography and photothermography are also well known from hundreds of publications including U.S. Pat. No. 5,817,598 (Defieuw et al.), U.S. Pat. No. 6,514,678 (Burgmaier et al.), U.S. Pat. No. 6,509,296 (Lelental et al.), and U.S. Pat. No. 6,514,677 (Ramsden et al.), all of which are incorporated herein by reference. Imaging, processing, and use of the noted imaging members would be readily apparent to one skilled in the art.

The remainder of the disclosure will be directed to the preferred lithographic imaging members, but it is to be understood that the invention is not limited thereto. By "lithographic imaging members", it is meant to include, where appropriate, lithographic printing plates as well as lithographic printing plate precursors (plate members prior to imaging).

The imaging members of this invention comprise a support and one or more imaging layers disposed thereon that include suitable imaging components. The support can be any self-supporting material including polymeric films, glass, ceramics, cellulosic materials (including papers), metals (such as aluminum, zinc, titanium, or alloys thereof) or stiff papers, or a lamination of any of these materials. The thickness of the support can be varied. In most lithographic applications, the thickness should be sufficient to sustain the wear from printing and thin enough to wrap around a printing form. A preferred embodiment for lithographic members uses a polyester support prepared from, for example, polyethylene terephthalate or polyethylene naphthalate, and having a thickness of from about 100 to about 310 $\mu$m. Another preferred embodiment uses aluminum sheets having a thickness of from about 100 to about 600 $\mu$m and that may be anodized and/or treated by graining using techniques known in the art. The support should resist dimensional change under conditions of use.

While a variety of imaging members of the present invention can be prepared as described herein, they are preferably lithographic imaging members whereby the imaging layer(s) and protective layer formulations have been applied to a suitable support and dried. The imaging layer(s) is usually a thermally sensitive imaging layer that can be imagewise exposed to thermal radiation such that regions of the layer(s) exposed to the radiation are less developable (more hydrophobic) in fountain solution and/or lithographic ink than non-exposed regions. The fountain solution and/or lithographic ink removed non-exposed regions of the imaging layer(s) to form imaged regions that are able to take up printing ink and to transfer it to a desired medium.

In lithography, the support may also be a cylindrical support that includes printing cylinders on press as well as printing sleeves that are fitted over printing cylinders. The use of such supports to provide cylindrical imaging members is described in U.S. Pat. No. 5,713,287 (Gelbart). An aqueous imaging composition can be coated or sprayed directly onto the cylindrical surface (or other support) that is an integral part of the printing press and the protective layer formulation (described below) is applied thereto to provide a lithographic imaging member (or printing plate) on-press.

The support may be coated with one or more "subbing" layers to improve adhesion of the imaging layer(s) to the support. Examples of subbing layer materials include, but are not limited to, gelatin and other naturally occurring and synthetic hydrophilic colloids and vinyl polymers (such as vinylidene chloride copolymers) that are known for such purposes in the photographic industry, vinyl phosphonic acid polymers, sol gel materials such as those prepared from alkoxysilanes (including glycidoxypropyltriethoxysilane and aminopropyltriethoxysilane), epoxy functional polymers, and various ceramics.

The backside of the support may be coated with antistatic agents and/or slipping layers or matte layers to improve handling and "feel" of the imaging member, or there may be additional imaging layers on the backside such as are used in dual-coated radiographic films.

The imaging members, however, preferably have only one imaging layer on one side of the support.

Imaging Layer Formulations

The one or more imaging layers are provided from an aqueous formulation comprising one or more imaging components and in preferred embodiments, it can be removed using water or an aqueous solvent during or after imaging. In other embodiments, the imaging layer is crosslinked and is removed only with ablation or other high energy imaging techniques.

In preferred embodiments, the imaging layer is prepared from a heat-sensitive composition that includes one or more heat-sensitive charged polymers and one or more photothermal conversion material(s) (both described below). The exposed (imaged) areas of the layer are rendered more hydrophobic in nature while the unexposed areas remain hydrophilic in nature.

Heat-Sensitive "Switchable" Imaging Layers:

Such charged polymers (ionomers) useful in the practice of this invention can be in any of three broad classes of materials:

I) crosslinked or uncrosslinked vinyl polymers comprising recurring units comprising positively-charged, pendant N-alkylated aromatic heterocyclic groups such as those described in U.S. Pat. No. 6,190,831 (Leon et al.) that is incorporated herein by reference, II) crosslinked or uncrosslinked polymers comprising recurring organoonium groups such as those described in U.S. Pat. No. 6,190,830 (Leon et al.) that is incorporated herein by reference, III) polymers comprising a pendant thiosulfate (Bunte salt) group such as those described in U.S. Pat. No. 5,985,514 (Zheng et al.) that is incorporated herein by reference, and (IV) polymers comprising recurring units comprising carboxy or carboxylate groups.

The imaging layer can include mixtures of polymers from each class, or a mixture of one or more polymers of two or more classes.

Class I Polymers:

The Class I polymers generally have a molecular weight of at least 1000 and can be any of a wide variety of hydrophilic vinyl homopolymers and copolymers having the requisite positively-charged groups. They are prepared from ethylenically unsaturated polymerizable monomers using any conventional polymerization technique. Preferably, the polymers are copolymers prepared from two or more ethylenically unsaturated polymerizable monomers, at least one of which contains the desired pendant positively-charged group, and another monomer that is capable of providing other properties, such as crosslinking sites and possibly adhesion to the support. Procedures and reactants needed to prepare these polymers are well known. With the additional teaching provided herein, the known polymer reactants and conditions can be modified by a skilled artisan to attach a suitable cationic group. Further details are available in the noted U.S. Pat. No. 6,190,831.

Class II Polymers:

The Class II polymers also generally have a molecular weight of at least 1000. They can be any of a wide variety of vinyl or non-vinyl homopolymers and copolymers.

Non-vinyl polymers of Class II include, but are not limited to, polyesters, polyamides, polyamide-esters, polyarylene oxides and derivatives thereof, polyurethanes, polyxylylenes and derivatives thereof, silicon-based sol gels (solsesquioxanes), polyamidoamines, polyimides, polysulfones, polysiloxanes, polyethers, poly(ether ketones), poly(phenylene sulfide) ionomers, polysulfides, and poly(benzimidazoles). Preferably, such non-vinyl polymers are silicon based sol gels, poly(arylene oxides), poly (phenylene sulfide) ionomers, or polyxylylenes, and most preferably, they are poly(phenylene sulfide) ionomers. Procedures and reactants needed to prepare all of these types of polymers are well known. With the additional teaching provided herein, the known polymer reactants and conditions can be modified by a skilled artisan to incorporate or attach a suitable cationic organoonium moiety.

Silicon-based sol gels useful in this invention can be prepared as a crosslinked polymeric matrix containing a silicon colloid derived from di-, tri- or tetraalkoxy silanes. These colloids are formed by methods described in U.S. Pat. No. 2,244,325 (Bird), U.S. Pat. No. 2,574,902 (Bechtold et al.), and U.S. Pat. No. 2,597,872 (Her). Stable dispersions of such colloids can be conveniently purchased from companies such as the DuPont Company. A preferred sol-gel uses N-trimethoxysilylpropyl-N,N,N-trimethylammonium acetate both as the crosslinking agent and as the polymer layer forming material.

The presence of an organoonium moiety that is chemically incorporated into the polymer in some fashion apparently provides or facilitates the "switching" of the imaging layer from hydrophilic to oleophilic in the exposed areas upon exposure to energy that provides or generates heat, when the cationic moiety reacts with its counter ion. The net result is the loss of charge. Such reactions are more easily accomplished when the anion of the organoonium moiety is more nucleophilic and/or more basic, as described above for the Class I polymers.

The organoonium moiety within the polymer can be chosen from a trisubstituted sulfur moiety (organosulfonium), a tetrasubstituted nitrogen moiety (organoammonium), or a tetrasubstituted phosphorous moiety (organophosphonium). Further details are provided in the noted U.S. Pat. No. 6,190,830.

Class III Polymers:

Each of the Class III polymers has a molecular weight of at least 1000, and preferably of at least 5000. For example, the polymers can be vinyl homopolymers or copolymers prepared from one or more ethylenically unsaturated polymerizable monomers that are reacted together using known polymerization techniques and reactants. Alternatively, they can be addition homopolymers or copolymers (such as polyethers) prepared from one or more heterocyclic monomers that are reacted together using known polymerization techniques and reactants. Additionally, they can be condensation type polymers (such as polyesters, polyimides, polyamides or polyurethanes) prepared using known polymerization techniques and reactants. Whatever the type of polymers, at least 15 mol % (preferably 20 mol %) of the total recurring units in the polymer comprise the necessary heat-activatable thiosulfate groups. Further details are available in the noted U.S. Pat. No. 5,985,514.

Class IV Polymers:

Additional heat-sensitive ionomers useful in this invention comprise random recurring units at least some of which comprise carboxy (free acid) or various carboxylates (salts). The ionomers generally have a molecular weight of at least 3,000 and preferably of at least 20,000.

The ionomers randomly comprise one or more types of carboxy- or carboxylate-containing recurring units (or equivalent anhydride units) and optionally one or more other recurring units (non-carboxylated).

Further details of Class IV polymers are provided in EP 1 304 221A1 (Zheng et al.) and U.S. Pat. No. 6,447,978 (Leon et al.) and 6,451,500 (Leon). Preferred class IV polymers are those that contain repetitive quaternary ammonium carboxylate groups.

The imaging layer of the imaging member can include one or more Class I, II, III, or IV heat-sensitive polymers with or without minor amounts (less than 20 weight %, based on total dry weight of the layer) of additional binder or polymeric materials that will not adversely affect its imaging properties.

There are other "heat-sensitive" switchable polymers or formulations that are known in the art for use in lithographic printing plates so the present invention is not limited to the specific polymers mentioned above. For example, another publication describing useful heat-sensitive switchable polymers is U.S. Pat. No. 6,146,812 (Leon et al.).

Thermomeltable Imaging Layers:

Imaging members of this invention can also include what are known as "thermomeltable" imaging layers. Such imaging layers comprise hydrophobic "thermoplastic" polymer particles that are softened or melted under the influence of heat during imaging. The particles thereby coagulate or coalesce to form a hydrophobic agglomerate in the imaging layer so that the imaged areas become insoluble to water or aqueous solvents. Specific details of such imaging materials and layers are provided in, for example, EP 0 816 070B1 (Vermeersch et al.) and EP 1 106 347A1 (Kita et al.).

Ablatable Imaging Layers:

Imaging members of the present invention can also include ablatable imaging layers that can be partially or completely removed during thermal imaging to expose the underlayer (usually the support) and thereby provide regions of hydrophilicity and regions of hydrophobicity. Of course, in such instances, the protective layer is imagewise removed during thermal ablation. Further details about ablatable imaging layers are found in numerous publications including, for example, U.S. Pat. Nos. 5,691,114 (Burberry et al.), 5,674,658 (Burberry et al.), and 6,397,749 (Kita et al.) and JP 2002-29166 (Aoshima et al.).

Cyanoacrylate Imaging Layers:

The imaging members of the present invention can also include heat-sensitive compositions that include heat-sensitive poly(cyanoacrylates) such as those described in U.S. Pat. No. 6,551,757 (Bailey et al.), incorporated herein by reference. Such imaging members comprise an imaging layer that includes a dispersion of at least 0.05 g/m$^2$ of a cyanoacrylate polymer that is thermally degradable below 200° C. The imaging layer also includes a photothermal conversion material that is present in an amount to provide a dry weight ratio to the cyanoacrylate polymer of from about 0.02:1 to about 0.8:1, and a hydrophilic binder to provide a dry weight ratio of a hydrophilic binder to the cyanoacrylate polymer of up to 1:1. Thermal imaging energy causes the exposed areas of the imaging layer to adhere to the support while unexposed areas can be readily washed off and/or simultaneously inked for press runs.

Combustible Particle Imaging Layers:

Other imaging members of this invention include an imaging layer comprising a water-soluble or water-dispersible binder and dispersed therein a photothermal conversion material, and particles that are at least partially combustible such as hybrid particles comprised of a combustible nitro-resin and a polymer derived from one or more ethylenically unsaturated polymerizable monomers.

In some embodiments, the hybrid particles are core-shell particles comprising a nitro-resin core and a shell at least partially disposed around the core comprised of the noted polymer, wherein the weight ratio of the nitro-resin core to the polymeric shell is from about 20:1 to about 0.2:1.

Thermal imaging results in the combustion of the thermally sensitive hybrid particles and the subsequent deposition of an insoluble residue in the imaged areas. The non-imaged areas are easily removed by the action of the press.

These hybrid particles include one or more nitro-resins and one or more addition polymers prepared from one or more ethylenically unsaturated polymerizable monomers. The nitro-resin(s) and addition polymer(s) can be homogeneously mixed within the particles or the particles can have regions of one type of polymer or the other. In preferred embodiments, the particles comprise a core of a nitro-resin that is at least partially covered with a shell of the addition polymer.

The "nitro-resin" is a self-combustible material and includes nitrocellulose and other nitrate esters of cellulosic materials (or carbohydrates) known in the art. Nitrocellulose is the preferred nitro-resin used in the present invention. A mixture of nitro-resins can also be used. The nitro-resins can be obtained from a number of commercial sources including Synthesia and Hercules Companies, or they can be prepared using starting materials and procedures known to a skilled polymer chemist.

The addition polymer(s) in the hybrid particles are derived from one or more water-insoluble ethylenically unsaturated polymerizable monomers (except styrene and styrene derivatives because their free radical polymerization is largely quenched by the presence of nitrocellulose).

More particularly, these one or more monomers are represented by the following Structure I:

$$CH_2{=}C(R)-X \qquad (I)$$

wherein R is hydrogen or methyl, and preferably R is hydrogen.

X is any monovalent moiety except a phenyl group. For example, X can be an alkyl ester, alkyl amide, aryl ester, or aryl amide group wherein the alkyl group is substituted or unsubstituted and comprises 1 to 16 carbon atoms (preferably from 1 to 6 carbon atoms), and the aryl group is substituted or unsubstituted and comprises 6 to 10 carbon atoms in the aromatic ring. Preferably, X is an alkyl ester or alkyl amide wherein the alkyl group is substituted or unsubstituted and has from 1 to 6 carbon atoms. Preferably, at least 90% by weight of the water-insoluble monomers used in this invention will have X moieties comprise less than 7 carbons.

Representative substituents on the noted alkyl or aryl groups include, but are not limited to, methyl, ethyl, iso-propyl, n-propyl, n-butyl, iso-butyl, t-butyl, neo-pentyl, phenyl, benzyl, cyclohexyl, iso-bornyl, and 2-ethylhexyl.

Representative monomers represented by Structure I include, but are not limited to, methyl acrylate, methyl methacrylate, ethyl acrylate, ethyl methacrylate, t-butyl methacrylate, iso-propyl acrylate, ethyl methacrylate, benzyl acrylate, benzyl methacrylate, propyl acrylate, propyl methacrylate, iso-propyl acrylate, isopropyl methacrylate, n-butyl acrylate, n-butyl methacrylate, hexyl acrylate, hexyl methacrylate, octadecyl methacrylate, octadecyl acrylate, lauryl methacrylate, lauryl acrylate, hydroxylauryl methacrylate, hydroxylauryl acrylate, phenethylacrylate, phenethyl methacrylate, 6-phenylhexyl acrylate, 6-phenylhexyl methacrylate, phenyllauryl acrylate, phenyllaurylmethacrylate, 3-nitrophenyl-6-hexyl methacrylate, cyclohexyl acrylate, 3-methacryloxypropyl-dimethylmethoxysilane, 3-methacryloxypropyl-methyldimethoxysilane, 3-methacryloxypropyl-pentamethyldisiloxane, 3-methacryloxypropyltris-(trimethylsiloxy)silane, 3-acryloxypropyl-dimethylmethoxysilane, acryloxypropylmethyldimethoxysilane, trifluoromethyl acrylate, trifluoromethyl methacrylate, tetrafluoropropyl acrylate, tetrafluoropropyl methacrylate, heptafluorobutyl methacrylate, iso-butyl acrylate, isobutyl methacrylate, 2-ethylhexyl acrylate, 2-ethylhexyl methacrylate, iso-octyl acrylate, iso-octyl methacrylate, N-t-butyl acrylamide, N-isopropyl acrylamide, N-cyclohexyl acrylamide, N-phenyl acrylamide, N,N-dihexyl acrylamide, N,N-dioctyl acrylamide, vinyl propionate, vinyl acetate, vinyl butyrate, methyl methacrylate, methyl acrylate, glycidyl acrylate, glycidyl methacrylate, vinyl 4-phenylpyrrolidone, allyl methacrylate, allyl acrylate, butenyl acrylate, undecenyl acrylate, undecenyl methacrylate, vinyl acrylate, and vinyl methacrylate. Preferred water-insoluble monomers are acrylate esters or with 4–9 carbons or acrylamides with 5–13 carbons. Mixtures of two or more monomers can be used if desired.

In addition (and indeed preferably), the addition polymer can be comprised of a "copolymer" that includes recurring units derived from two or more different ethylenically unsaturated polymerizable monomers, as long as at least one of those monomers is represented by Structure I. Such copolymers are included in the following Structure II (that also include polymers derived solely from monomers of Structure I):

$$-(A)_x-(B)_y- \qquad (II)$$

wherein "A" represents recurring units derived from said or more ethylenically unsaturated polymerizable monomers defined by Structure I, "B" represents recurring units derived from one or more "additional" ethylenically unsaturated polymerizable monomers, "x" represents from about 80 to 100 mol % (preferably from about 90 to 100 mol %), and "y" represents from 0 to about 20 mol % (preferably from 0 to about 10 mol %), based on total moles of recurring units.

The "additional" ethylenically unsaturated polymerizable monomers can be any ethylenically unsaturated polymerizable monomer other than those represented by Structure I. Such monomers include, but are not limited to, water-soluble or crosslinking ethylenically unsaturated polymerizable monomers.

Water-soluble monomers include but are not limited to, negatively or positively charged ethylenically unsaturated polymerizable monomers as well as hydroxy-containing ethylenically unsaturated polymerizable monomers. Such negatively or positively charged ethylenically unsaturated polymerizable monomers can comprise one or more carboxy, phospho, sulfonato, sulfo, quaternary ammonium, sulfonium, phosphonium, or polyethylene oxide groups in the molecule. Particularly, useful water-soluble monomers are those containing sulfonato or quaternary ammonium groups.

Useful crosslinking monomers include compounds containing two or more ethylenically unsaturated polymerizable groups. Useful crosslinking monomers include esters of saturated glycols or diols with unsaturated monocarboxylic acids, such as, ethylene glycol diacrylate, ethylene glycol dimethacrylate, triethylene glycol dimethacrylate, 1,4-butanediol dimethacrylate, 1,3-butanediol dimethacrylate, pentaerythritol tetraacrylate, trimethylol propane trimethacrylate, hexanediacrylate, cyclohexanedimethanoldivinyl ester, trimethylolpropane diacrylate, trimethylolpropane dimethacrylate, methylenebisacrylamide, polyethylene glycol diacrylate, and polyethylene glycol dimethacrylate.

Surrounding at least 50% (surface area), and preferably 80% (surface area), and most preferably 100% (surface area) of the core, is a polymeric shell that is composed of one or more addition polymers derived from one or more water-insoluble ethylenically unsaturated polymerizable monomers described above.

The combustible hybrid particles also preferably have a glass transition temperature of from about 25 to about 150° C., and most preferably of from about 40 to about 120° C. Glass transition temperature is a well known polymer parameter that can be measured using known procedures and equipment as described for example, in Turi, *Thermal Characterization of Polymeric Materials*, $2^{nd}$ Ed., Academic Press, 1997.

In addition, the hybrid particles are generally spherical in shape and have an average size (for example, diameter) of from about 0.03 to about 2.0 $\mu$m (preferably from about 0.03 to about 0.50 $\mu$m). The particle size can be measured using known equipment and procedures (such as the Mie scattering or photon correlation spectroscopy methods or by optical or electron microscopy). The particles may not be perfectly spherical and the size would then refer to the largest dimension.

In general, the particles have a distribution of nitro-resin and addition polymer that are defined by a weight ratio of the nitro-resin to the addition polymers of from about 0.2:1 to about 20:1, and preferably from about 0.5:1 to about 5:1. Where the hybrid particles are core-shell particles, these weight ratios would refer to the core nitro-resin to the shell polymers.

The hybrid particles described herein are generally present in the heat-sensitive imaging layers of the imaging materials in an amount of at least 25% (based on dry layer weight), and preferably at from about 75 to about 99%. The upper limit can vary depending upon a number of factors including the amount of combustible nitro-resin the particles, the energy of the imaging apparatus, the thickness of the imaging layer, the type and molecular weight of the binder polymer that may be present, and the characteristics of the photothermal conversion material. In general, the upper limit is 99 weight %. One skilled in the art would be able to determine the appropriate amount of hybrid particles in the heat-sensitive compositions of this invention in order to provide the desired dry layer amount.

Decarboxylation, Desulfonylation, Dephosphonylation Formulations:

Another class of thermally imageable compositions that is useful in the present invention includes polymers containing specific carboxylic acid, sulfonic acid, or phosphonic acid functions or their salts. These polymers, as described in EP 1 031 412A1 (Kawamura), will undergo decarboxylation, desulfonation, or dephosphonylation when exposed to heat, resulting in a change from a hydrophilic to a hydrophobic state. In the carboxylate or sulfonate polymers, the acidic moiety can be attached to a carbon containing an electron withdrawing function. These reactive functions may be represented by the following Formulae 4, 5, 6, and 7:

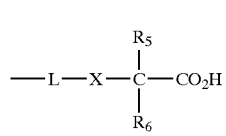
(4)

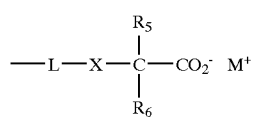
(5)

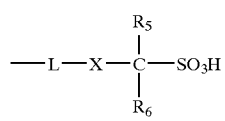
(6)

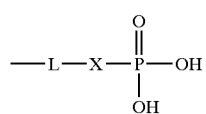
(7)

wherein X is selected from the group consisting of —CO—, —SO—, —SO—, and elements belonging to Groups VA (such as N) to VIA (such as O and S) of the Periodic Table, with the proviso that the element belonging Group VA forms a divalent group with a hydrogen atom or a substituent, L represents a polyvalent organic group composed of nonmetallic atoms necessary for linking the functional group represented by Formula (5), (6), (7) or (8) to a polymer skeleton.

$R_5$ and $R_6$, which may be the same or different, each represents hydrogen, a substituted or unsubstituted aryl group or a substituted or unsubstituted alkyl group. M is selected from the group consisting of alkali metals, alkaline earth metals, and onium ions.

Among these, the carboxylic acid groups, the carboxylate groups, and the sulfonic acid groups represented by Formulae (5), (6) and (7), respectively, are preferred. More preferred are the carboxylate groups represented by Formula (6).

Another class of thermally imageable compositions that are useful in the present invention includes polymers containing thermolabile sulfonate ester, sulfonimide, disulfone, and alkoxyalkyl ester groups. These materials are described in EP 0 855 267A1 (Maemoto et al.) and EP 1 031 412 (noted above) that are incorporated herein by reference. These polymers will change from hydrophobic to hydrophilic when acted upon by heat, optionally in combination with acid.

The sulfonate ester group, disulfone group, and sulfonimide group can be represented by the following general Formulae 1, 2, and 3 respectively:

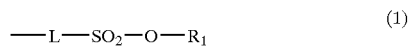
(1)

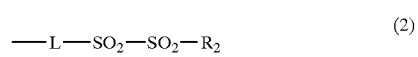
(2)

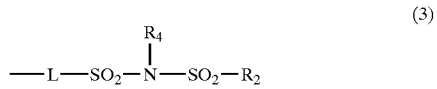
(3)

wherein L represents an organic group composed of polyvalent nonmetallic atoms required for connecting the functional group represented by the general Formula (1), (2) or (3) to the polymer skeleton.

$R_1$, $R_2$, and $R_4$ each represents a substituted or unsubstituted aryl group, substituted or unsubstituted alkyl group or cyclic imide group. The substituted or unsubstituted aryl group can be carbocyclic or heterocyclic. Representative carbocyclic aryl groups include carboxy-substituted phenyl, naphthyl, anthracenyl, and pyrenyl groups. Representative heterocyclic aryl groups have from 3 to 20 carbon atoms and from 1 to 5 heteroatoms such as pyridyl, furyl, and other heterocyclic groups obtained by the condensation of benzene rings, for example, quinolyl, benzofuryl, thioxanthone, and carbazole groups. The substituted or unsubstituted alkyl group include a straight-chain, branched, or cyclic alkyl (cycloalkyl) group having from 1 to 25 carbon atoms such as substituted or unsubstituted methyl, ethyl, isopropyl, t-butyl, and cyclohexyl groups.

Photothermal Conversion Materials

When heat-sensitive polymers are used in the imaging layers, it is desirable also to include one or more photothermal conversion materials in those layers to absorb appropriate radiation from an appropriate energy source (such as a laser), which radiation is converted into thermal energy. Thus, such materials convert photons into heat. Preferably, the radiation absorbed is in the infrared and near-infrared regions of the electromagnetic spectrum. For example, the photothermal conversion materials can be bis(aminoaryl) polymethine IR dyes. This class of polymethine dyes are known and disclosed by Tuemmler et al., *J. Am. Chem. Soc.* 80, 3772 (1958), Lorenz et al., *Helv. Chem. Acta.* 28, 600, (1945), U.S. Pat. No. 2,813,802 (Ingle), U.S. Pat. No. 2,992,938 (McCarville), U.S. Pat. No. 3,099,630 (Wildi et al.), U.S. Pat. No. 3,275,442 (Kosenkranius), U.S. Pat. No. 3,436,353 (Dreyer et al.), U.S. Pat. No. 4,547,444 (Bell et al.), U.S. Pat. No. 5,135,842 (Kitchin et al.), and EP 0 652 483A1 (Ellis et al.).

Other useful photothermal conversion materials include various IR dyes, carbon black, polymer-grafted carbon, surface-functionalized carbon blacks, pigments, evaporated pigments, semiconductor materials, alloys, metals, metal oxides, metal sulfides or combinations thereof, or a dichroic stack of materials that absorb radiation by virtue of their refractive index and thickness. Borides, carbides, nitrides, carbonitrides, bronze-structured oxides and oxides structurally related to the bronze family but lacking the $WO_{2.9}$ component, are also useful. Particular dyes of interest are "broad band" dyes, that is those that absorb over a wide band of the spectrum.

Still other useful photothermal conversion materials include Prussian Blue, Paris Blue, Milori Blue, cyanine dyes, indoaniline dyes, oxonol dyes, porphyrin derivatives, anthraquinone dyes, merostyryl dyes, pyrylium compounds, or squarylium derivatives with the appropriate absorption spectrum and solubility. Dyes with a high extinction coefficient in the range of 750 nm to 1200 nm may also be suitable. Suitable absorbing dyes are also disclosed in numerous publications, for example, EP 0 823 327A1 (Nagasaki et al.), U.S. Pat. No. 4,973,572 (DeBoer), U.S. Pat. No. 5,244,771 (Jandrue et al.), U.S. Pat. No. 5,401,618 (Jandrue et al.), and U.S. Pat. No. 6,248,886 (Williams et al.). Examples of useful cyanine dyes include 2-[2-[2-phenylsulfonyl-3-[2-(1,3-dihydro-1,3,3-trimethyl-2H-indol-2-ylidene)-ethylidene]-1-cyclohexen-1-yl]-ethenyl]-1,3,3-trimethyl-3H-indolium chloride, 2-[2-[2-thiophenyl-3-[2-(1,3-dihydro-1,3,3-trimethyl-2H-indol-2-ylidene)-ethylidene]-1-cyclohexen-1-yl]-ethenyl]-1,3,3-trimethyl-3H-indolium chloride, 2-[2-[2-thiophenyl-3-[2-(1,3-dihydro-1,3,3-trimethyl-2H-indol-2-ylidene)-ethylidene]-1-cyclopenten-1-yl]-ethenyl]-1,3,3-trimethyl-3H-indolium tosylate, 2-[2-[2-chloro-3-[2-ethyl-(3H-benzthiazole-2-ylidene)-ethylidene]-1-cyclohexen-1-yl]-ethenyl]-3-ethyl-benzthiazolium tosylate, and 2-[2-[2-chloro-3-[2-1,3-dihydro-1,3,3-trimethyl-2H-indol-2-ylidene)-ethylidene ]-1-cyclohexen-1-yl]-ethenyl]-1,3,3-trimethyl-3H-indolium tosylate. Other examples of useful absorbing dyes include ADS-830A and ADS-1064 (American Dye Source, Montreal, Canada), EC2117 (FEW, Wolfen, Germany), Cyasorb IR 99 and Cyasorb IR 165 (Glendale Protective Technology), Epolite IV-62B and Epolite III-178 (Epoline), PINA-780 (Allied Signal), SpectraIR 830A and SpectraIR 840A (Spectra Colors).

Additional examples of suitable IR dyes may include, but are not limited to, bis(dichlorobenzene-1,2-thiol)nickel(2:1) tetrabutyl ammonium chloride, tetrachlorophthalocyanine aluminum chloride, and the compounds provided in the following IR DYE TABLE.

| IR DYE TABLE | |
|---|---|
| IR DYE | STRUCTURE |
| IR DYE 1 | 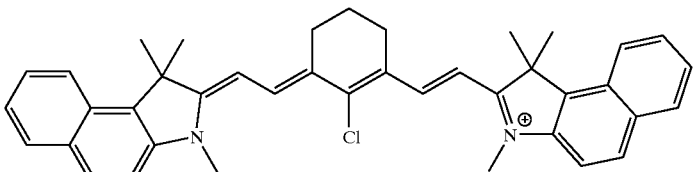  |
| IR DYE 2 | 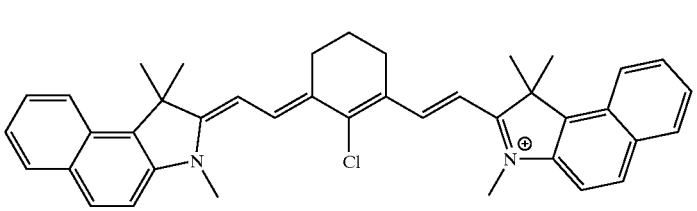 |
| IR DYE 3 | 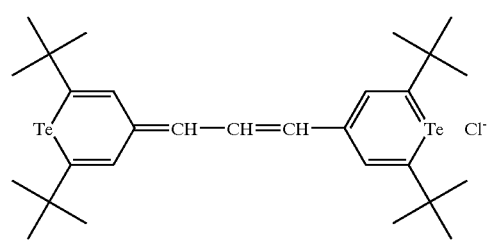 |

-continued
IR DYE TABLE
| IR DYE | STRUCTURE |
|---|---|
| IR DYE 4 | 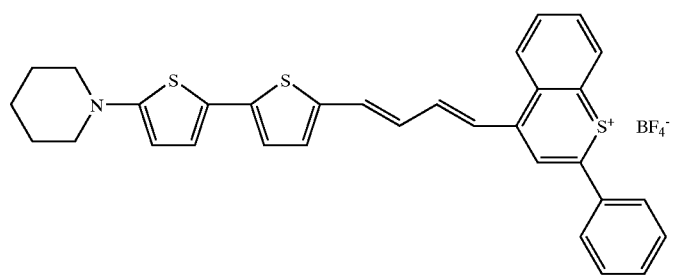 |
| IR DYE 5 | 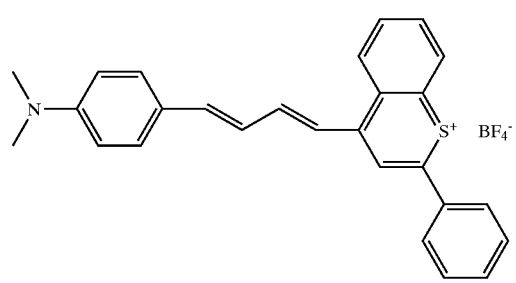 |
| IR DYE 6 | 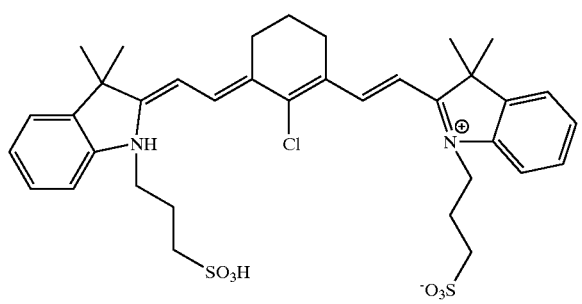 |
| IR DYE 7 | 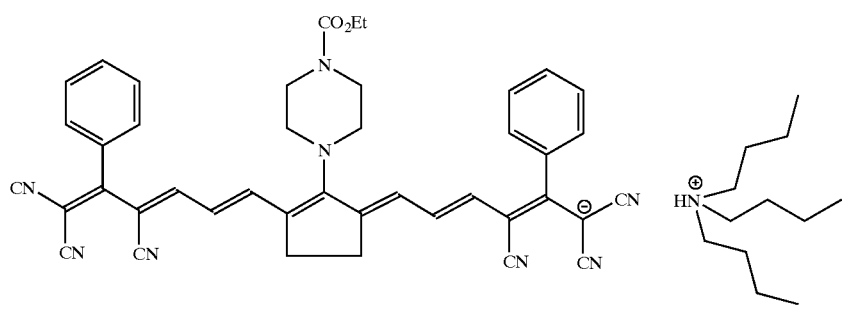 |
| IR DYE 8 | 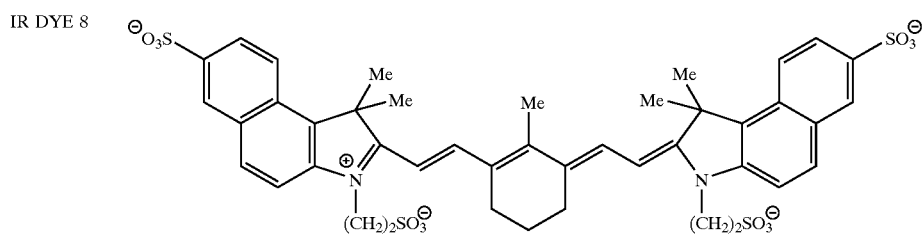 |

IR DYE TABLE
| IR DYE | STRUCTURE |
|---|---|
| IR DYE 9 | 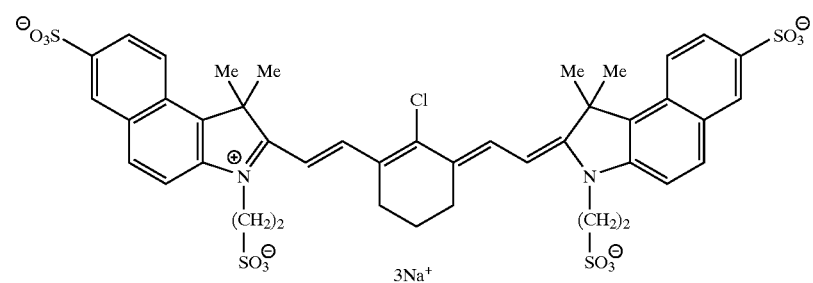 |
| IR DYE 10 | 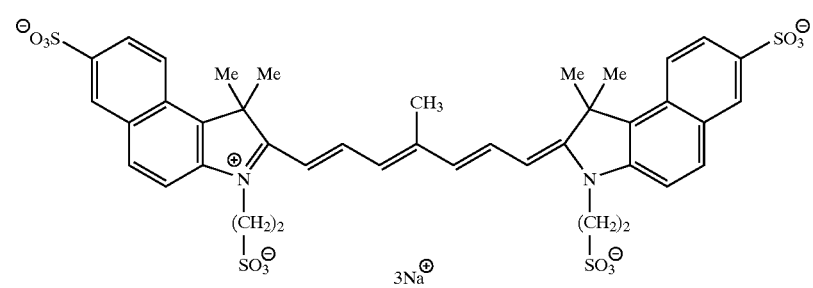 |
| IR DYE 11 | 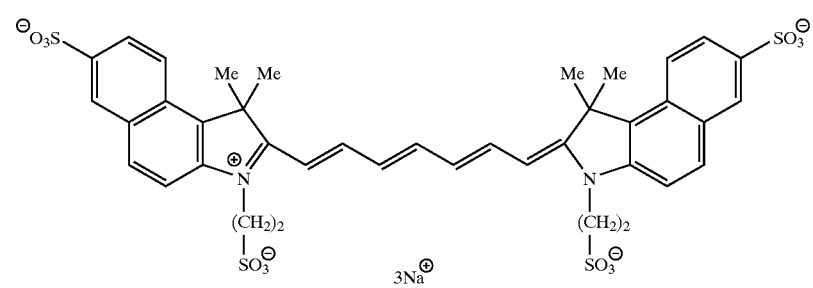 |
| IR DYE 12 | 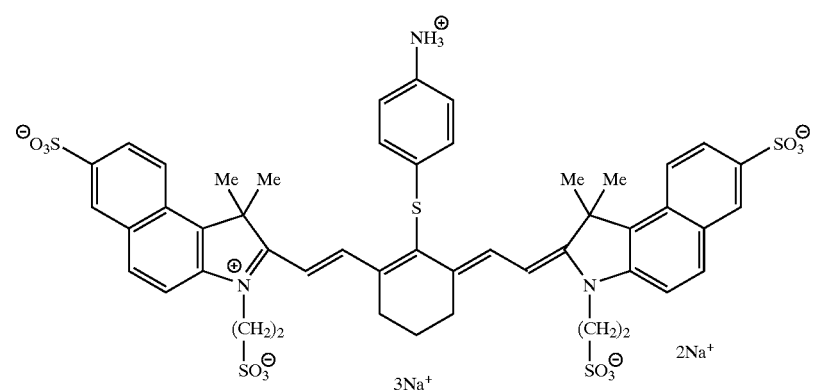 |

-continued

IR DYE TABLE

| IR DYE | STRUCTURE |
|---|---|
| IR DYE 13 | 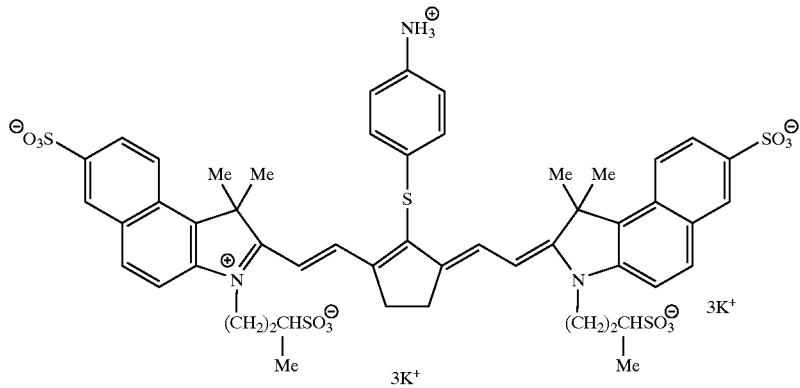 |
| IR DYE 14 | 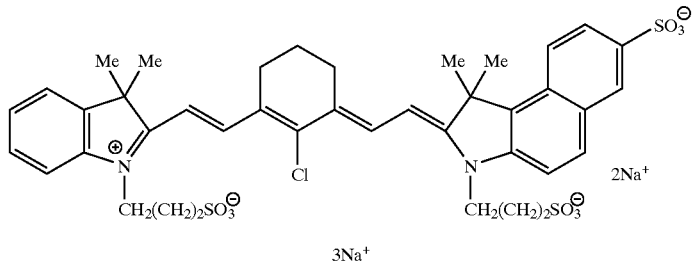 |
| IR DYE 15 | 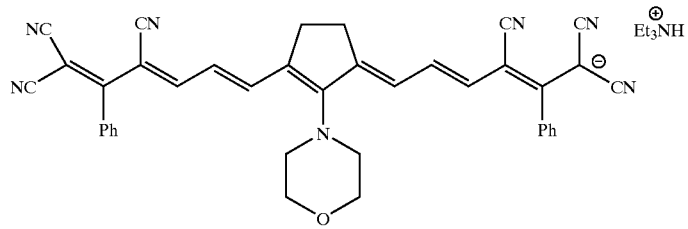 |

IR Dyes 1–7 may be prepared using known procedures or may be obtained from several commercial sources (for example, Esprit, Sarasota, Fla.). IR dyes 8–15 may also be prepared using known procedures, as reported, for example, in U.S. Pat. No. 4,871,656 (Parton et al.) and references reported therein (for example, U.S. Pat. No. 2,895,955, U.S. Pat. No. 3,148,187, and U.S. Pat. No. 3,423,207).

The imaging layer composition can be applied as an aqueous formulation to a support using any suitable equipment and procedure, such as spin coating, knife coating, gravure coating, dip coating or extrusion hopper coating.

In addition, the composition can be sprayed onto a support, including a cylindrical support, using any suitable spraying means for example as described in U.S. Pat. No. 5,713,287 (noted above).

The imaging layer compositions are generally formulated in and coated from water alone or with water-miscible organic solvents including, but not limited to, water-miscible alcohols (for example, methanol, ethanol, isopropanol, 1-methoxy-2-propanol, and n-propanol), methyl ethyl ketone, tetrahydrofuran, acetonitrile, N-N-dimethylformamide, butyrolactone, and acetone. Water and mixtures of water with methanol, ethanol, and 1-methoxy-2-propanol are preferred. By "water-miscible" is meant that the solvent is soluble in water at all proportions at room temperature.

Protective Layer

Simultaneously or subsequently to application of the imaging layer formulation(s), a non-aqueous inverse emulsion is applied directly over the imaging layer(s) out of a suitable water-immiscible organic solvent such as a branched and unbranched hydrocarbon or hydrocarbon mixture (for example ligroins and petroleum ethers), toluene, carbon disulfide, chloromethane, dichloromethane, chloroform, ethyl acetate, n-propyl acetate, iso-propyl acetate, vinyl chloride, methyl ethyl ketone (MEK), cyclopentanone, methyl isobutyl ketone, trichloromethane, carbon tetrachloride, ethylene chloride, trichloroethane, toluene, xylene, cyclohexanone, 2-nitropropane, and others known in the art. Preferred are toluene, n-hexane, n-heptane, n-octane, isooctane, ligroins, and petroleum ethers that have boiling points between 50 and 120° C.

As is known in the art, an "inverse" emulsion is a suspension of a discontinuous liquid or solid phase in a water-immiscible continuous phase. The continuous phase may be any of the water-immiscible solvents listed above. For the purposes of this invention, the discontinuous phase consists of hydrophilic, water-swellable particles that have a diameter of from about 0.02 to about 5.0 μm. Preferably, the diameter of the particles is from about 0.03 to about 1.0 μm. Most preferably, the diameter of the particles is from about 0.04 to about 0.20 μm.

Upon drying, the inverse emulsion remains in the form of discrete microgel particles.

By "water-swellable", it is meant that the particles are capable of absorbing at least 5% of their dry weight in water. Preferably, the particles will be capable of absorbing at least 50% of their weight in water and more preferably, the particles will be crosslinked. The particles may exist in the water-immiscible continuous phase as dry particles or they may optionally be swelled with water or a combination of water and one or more water-miscible solvents.

The particles may comprise naturally occurring or synthetic hydrophilic polymers. Naturally occurring polymers may include, but are not limited to gelatin (and derivatives thereof), alginates, carrageenin, agarose, cellulosic materials, dextran, gellan gum, gum arabica, albumin, chitosan, pectin, gluten, fibrinogen, casein, and starch. Useful synthetic polymers include, but are not limited to those derived from the addition polymerization of ethylenically unsaturated polymerizable monomers of which greater than 10% by weight of the total monomers are water-soluble. Preferably, greater than 25% of the total monomers are water-soluble. Most preferably, 100% of the total monomers will be water-soluble. Water-soluble monomers include poly(ethylene oxide) acrylate and methacrylate esters, vinyl (pyridines), hydroxyethyl acrylate, glycerol acrylate and methacrylate esters, acrylamide, methacrylamide N-vinylpyrrolidone, vinylbenzyltrimethyl ammonium chloride, vinylbenzyldimethyl-dodecylammonium chloride, [2-methacryloyloxy)ethyl]trimethyl ammonium chloride, [2-(acryloyloxy)ethyl]-trimethylammonium p-toluenesulfonate, acrylic acid and salts thereof, methacrylic acid and salts thereof, diallyldimethylammonium chloride, fumaric acid and salts thereof, maleic acid and salts thereof, itaconic acid and salts thereof, vinylsulfonic acid and salts thereof, and vinylphosphonic acid and salts thereof.

Preferably, the particles comprise from about 0.25 to about 10% of a crosslinking monomer (based on total recurring units). Most preferably, this range will be from about 0.5 to about 5%. Crosslinking monomers include, but are not limited to methylenebisacrylamide, poly(ethylene glycol diacrylate), and poly(ethylene glycol dimethacrylate).

Preferably, the particles are composed of one or more of the following monomers: acrylic acid and salts thereof, methacrylic acid and salts thereof, acrylamide, methacrylamide, poly(ethylene glycol acrylate), poly(ethylene glycol methacrylate), N-vinylpyrrolidone, and hydroxyethyl acrylate as well as one or more of the following crosslinking monomers: methylenebisacrylamide, poly(ethylene glycol diacrylate), and poly(ethylene glycol dimethacrylate).

The water-swellable particles useful in the present invention may be prepared by any method known in the art provided they can be prepared in an inverse emulsion form or can be subsequently dispersed in a water-immiscible solvent. Preferably, the particles are prepared via a method that yields a suspension of the particles in the solvent of choice. This can be achieved via any water-in-oil polymerization method such as an inverse emulsion polymerization, inverse mini-emulsion polymerization, or inverse suspension polymerization. Alternately, pre-formed polymers can be crosslinked within a water-in-oil emulsion to yield water-swellable particles (such as described in U.S. Pat. No. 6,544,503 of Vanderhoffet al. and in *Polym. Eng. Sci.* 1989, 29, 1746–1758.). Other methods that can yield water-swellable particles include desolvation processes (see *J. Microencapsulation* 2000, 17, 187–193), coacervation processes (see *Polym. Eng. Sci.* 1990, 30, 905–924) and non-aqueous dispersion polymerization of hydrophilic monomers (see *J. Polym. Sci A: Polym. Chem.* 1996, 34, 175–182 and *Journal of Polymer Science. Part A: Polymer Chemistry* 2000, 38, 653–663).

Preferably, the particles will be prepared by an inverse heterogeneous free radical polymerization process. Such processes involve the free radical polymerization of one or more ethylenically unsaturated polyrnerizable monomers that are soluble in water or in a mixture of water and a water-miscible solvent within a continuous phase consisting of a water-immiscible liquid. Optionally, water is also present in the reaction mixture. Water-soluble or oil-soluble initiators can be used and an oil-in-water emulsifier is also present. The end product is an inverse (that is, water-in-oil) emulsion of hydrophilic polymer particles in a water-immiscible continuous phase. These processes can be nominally broken down into the following categories that ostensibly vary according to the thermodynamic stability of the inverse emulsion, and whether or not the particles are nucleated and grow within the water-immiscible phase or whether polymerization takes place within preformed water droplets: inverse emulsion polymerization, inverse micro-emulsion polymerization, inverse suspension polymerization, and inverse mini-emulsion polymerization. Often more than one mechanism occurs simultaneously or the mechanisms differ as a continuum rather than as discrete processes. Inverse emulsion and micro-emulsion polymerization procedures are reviewed in *Emulsion Polymerization and Emulsion Polymers*, Lovell, P. A. and El-Aaser, M. S., Eds. John Wiley and Sons: Chichester, 1997, pp 723–741 and in *Adv. Chem. Ser.* 1962, 34, 32–51. Inverse suspension polymerization processes are described in *J. Appl. Polym. Sci.* 1999, 73, 2273–2291 and in *Journal of Applied Polymer Science* 65, 789–794. Inverse mini-emulsion process are disclosed in *Macromolecules* 2000, 33, 2370–2376.

The resulting protective layer can also include small amounts (up to 10% of the solids in the coating formulation) of an organic solvent-soluble binder polymer. This polymer can be of any composition as long as it has a molecular weight of at least 5000 and is soluble in the water-imniiscible coating solvent.

The various formulations used to provide the imaging and overcoat layers described herein can be applied to the support using conventional means such as curtain coating, spin coating, hopper coating, knife coating, and other methods known to one skilled in the art using equipment, conditions, and procedures that would be readily apparent to one skilled in the art. The imaging layer(s) and protective layer can be applied sequentially or simultaneously, with or without drying between coating passes. Preferably, the layer are applied simultaneously without intermediate drying because of the nature of the different formulations, the coated layers will intermix very little. Coating speeds can vary depending upon the particular equipment being used and a skilled artisan would be able to design the optimal coating conditions for a given set of formulations.

The following examples illustrate the practice of the invention, and are not meant to limit it in any way.

PREPARATIVE EXAMPLE 1

Preparation of Thermoreactive Dispersion 1-cyanoacrylate Particles

A mixture of methyl cyanoacrylate (9.6 g) and ethyl cyanoacrylate (2.4 g) were added to a solution of Aerosol OT surfactant (0.52 g) in ethyl acetate (150 g) followed by 5 drops of a solution of triethylamine (10 drops) in ethyl acetate (10 ml). The solution warmed slightly due to the polymerization exotherm and the appearance turned to a haze indicating the formation of particles. Particle size analysis using a Horiba LA-920 instrument indicated an average particle size of 0. 12 μm and a standard deviation of 0.04 μm.

PREPARATIVE EXAMPLE 2

Preparation of Thermoreactive Dispersion 2-Nitrocellulose Microparticles

Nitrocellulose (71.43 g, 70% in isopropanol, falling ball viscosity in 20:25:55 ethanol-toluene-ethyl acetate=18–25 cps) was dissolved in 200 g of ethyl acetate. Simultaneously, 75 g of a 10% aqueous solution of Alkanol XC® (an anionic surfactant obtained from E. I. DuPont de Nemours & Co) were dissolved in 500 g of water. The two solutions were combined and emulsified, first using a Silverson L4 mixer on the highest setting then by passage twice through an M-110T Microfluidizer (sold by Microfluidics). The volatile liquids were then stripped via rotary evaporation for 15–30 minutes after the condensates were observed as coming over as a single phase (water). As cellulose nitrate is highly combustible in the dry state, the % solids were determined indirectly (via a subtractive method by Karl Fischer titration for water) to be 9.0%. Particle size analysis by photon correlation spectroscopy using an Ultrafine Particle Analyzer instrument (Microtrac UPA150) showed a median particle diameter of 0.0536 μm.

PREPARATIVE EXAMPLE 3

Preparation of Thermoreactive Dispersion 3-Core/shell Particles Having a Nitrocellulose Core and a Poly(t-butyl acrylate-co-sulfopropyl acrylate) Shell The nitrocellulose dispersion (100 ml) of Preparative Example 1 was dialyzed for 16 hours using a 15K cutoff membrane to remove excess surfactant. The dialyzed dispersion was combined with 0.05 g of azobiscyanovaleric acid in a 500 ml 3-neck round bottom flask equipped with a magnetic stir bar, condenser, nitrogen inlet, and a rubber septum. Through the rubber septum was inserted a length of semi-rigid plastic tubing leading to a solvent pump fed through a second round bottom flask containing a rapidly stirring monomer suspension consisting of 12.74 g of t-butyl acrylate, 0.26 g of potassium 3-sulfopropyl acrylate, 0.13 g of sodium dodecyl sulfate, 26.0 g of water, and 0.05 g of azobiscyanovaleric acid (pH adjusted to 7.0 with KOH). The contents of both flasks were bubble degassed with nitrogen for 10 minutes and the reactor flask was immersed in an oil bath at 70° C. The monomer suspension was added via the solvent pump over 90 minutes. The reaction was allowed to proceed for an additional 60 minutes at 70° C., then for 16 hours at 60° C. (10.2% solids). The median particle diameter was determined to be 0.0589 μm. The curve shape of the particle size distribution was identical to that obtained in Preparative Example 1 and slightly shifted to larger particle sizes. Examination of the particles by scanning electron microscopy showed a single distribution of particles.

PREPARATIVE EXAMPLE 4

Preparation of Thermoreactive Dispersion 4-Core/shell Particles Having a Nitrocellulose Core and a Poly(phenyl Acrylate-co Sulfopropyl Acrylate) Shell This particle dispersion was prepared using the identical method and components as that described in Preparative Example 2, except that 12.74 g of phenyl acrylate was used instead of the t-butyl acrylate (12.4% solids). The median particle diameter was found to be 0.0664 μm with the same retention of curve shape observed in Preparative Example 2. Examination of the particles by scanning electron microscopy showed a single distribution of particles.

PREPARATIVE EXAMPLES 5–7

Preparation of Inverse Emulsions 2–4

Inverse Emulsions 2–4 were prepared using an identical procedure and the components described below in TABLE I. A solution of the ethylenically unsaturated polymerizable monomers (first 5 components) and the sodium persulfate was prepared in water. In the case where acrylic acid was used (Inverse Emulsion 1), the acrylic acid was first neutralized with NaOH in the water with cooling in an ice bath and the other monomers were then added. The N-benzyl N,N,N-triethanolammonium bromide was next added (in the case of Inverse emulsion 1). A solution of the Hypermer® 2296 emulsifier in the heptane was prepared and the aqueous and organic solutions were combined in a beaker. The combined solutions were emulsified first using a Silverson L4 mixer on the highest setting for 2 minutes then by passage twice through an M-110T Microfluidizer (sold by Microfluidics). The translucent emulsion was poured into a 1 liter 3-neck round bottom flask outfitted with a magnetic stir bar, condenser, and nitrogen inlet and was bubble degassed with nitrogen for 30 minutes. The flask was lowered into an oil bath at 40° C. and a degassed solution of sodium meta-bisulfite ion (in 3–4 g of water) was added. The reaction mixture was stirred at 40° C. for 2 hours and filtered through cheesecloth to separate out a small amount of coagulum.

TABLE I

| Inverse Emulsion # | 2 | 3 | 4 |
|---|---|---|---|
| Acrylamide (g) | 10.60 | 21.20 | — |
| Acrylic acid (g) | 31.81 | — | — |
| Hydroxyethyl acrylate (g) | — | — | 42.41 |
| PEG acrylate[1] (g) | — | 21.20 | — |
| Methylenebisacrylamide (g) | 0.43 | 0.44 | 0.43 |
| NaOH[2] (g) | 16.4 | | |
| Water (g) | 57.11 | 42.84 | 42.84 |
| Sodium meta-bisulfite (g) | 0.23 | 0.23 | 0.23 |
| Sodium persulfate (g) | 0.23 | 0.23 | 0.23 |
| N-Benzyl N,N,N-triethanolammonium bromide (g) | — | — | 1.00 |
| Hypermer ® 2296[3] (g) | 11.26 | 4.50 | 4.50 |
| n-heptane (g) | 375.3 | 300.0 | 300.0 |

TABLE I-continued

| Inverse Emulsion # | 2 | 3 | 4 |
|---|---|---|---|
| Median particle diameter[4] (microns) | 0.1–0.2 | 0.2208 | 0.3605 |
| % solids | 13.4 | 8.34 | 12.40 |

[1]Mn ~ 375 AMU
[2]Pellets, 97%
[3]A polymeric water-in-oil emulsifier obtained from Uniquema Inc.
[4]Determined by scanning electron microscopy for Inverse Emulsion 1. Determined by photon correlation spectroscopy for Inverse Emulsions 3 and 4.

WORKING EXAMPLE 1

Preparation and Evaluation of Thermal Processless Printing Plates Containing Poly(cyanoacrylate) Particles in an Overcoat An ethyl acetate dispersion of cyanoacrylate polymer (preparative example 1) was mixed with poly(vinyl pyrrolidone) and IR Dye 1 in a weight ratio of 67-18-6 and diluted with ethanol and ethyl acetate to give a 4.33% solids coating solution in 50/50 ethyl acetate/ethanol. The mixture was coated at 2.5 cm$^3$/ft$^2$ (27 cm$^3$/m$^2$) onto several strips of a brush and electrochemically grained, sulfuric acid anodized, silicate post-treated 12 mil (304.8 μm) lithographic aluminum substrate to provide a dry coverage of 91 mg/ft$^2$ (0.98 g/m$^2$) using conventional coating equipment. The coatings were dried at 35° C. for 5 minutes.

Strips of the imaging layer as described above were overcoated with Inverse Emulsion 2 ("IE2") that was directly applied to provide a dry coverage of 80 mg/ft$^2$ (0.86 g/m$^2$) or 160 mg/ft$^2$ (1.72 g/m$^2$) using the same coating equipment. In addition, strips were overcoated with a poly (vinyl alcohol) (PVOH, 54,000 molecular weight) water solution to provide a dry coverage of 80 mg/ft$^2$ (0.86 g/m$^2$) or 160 mg/ft$^2$ (1.72 g/m$^2$). The resulting imaging members were allowed to dry for 24 hours at ambient conditions.

The imaging members were thermally imaged using a commercially available Creo Trendsetter 3244 imaging device to form printing plates. Each printing plate was patterned with two vertical stripes representing net exposures of 350 and 450 mJ/cm$^2$. In addition, a second set of plates was exposed with a sheet of clear plastic Mylar covering the surface. Visual inspection of the plastic for haze was taken as an indication of ablation debris being discharged from the plate during exposure. The plates were mounted on an A. B. Dick duplicator press and run to 2000 impressions. The plates reached comparable printing densities by 25–50 impressions and printed with acceptable quality to 1000 impressions. The results are summarized in TABLE II below.

TABLE II

| Plate | Overcoat | Coverage (mg/ft2) | Printable Image | Image Swirls | Debris on Mylar Sheet |
|---|---|---|---|---|---|
| A | IE2 | 80 | Yes | none | yes |
| B | IE2 | 160 | Yes | none | none |
| C | PVOH | 80 | Yes | severe | none |
| D | PVOH | 160 | Yes | severe | none |
| E | None | 0 | Yes | none | yes |

Plate E (without an overcoat) provided an acceptable image but the haze that transferred to the Mylar cover sheet indicated that ablation debris was given off. Plates C and D showed that a PVOH overcoat could suppress the ablation products, however the overcoat created a severe coating intermixing swirl pattern in the image that was not evident in Plate E. Plate B showed that the "IE2" protective overcoat used according to the present invention did not disrupt the imaging layer and if present in sufficient thickness suppressed the formation of the ablation debris.

WORKING EXAMPLES 2

Thermal Processless Printing Plates Containing Nitrocellulose Particles or Core/shell Nitrocellulose Particles Three coating solutions were formulated by combining the components listed in TABLE III below and stirring until all of the reagents had dissolved. The coating solutions were each coated onto several strips of a brush and electrochemically grained, sulfuric acid anodized, silicate post-treated 12 mil (304.8 μm) lithographic aluminum substrate to provide a dry coverage of 100 mg/ft$^2$ (1.08 g/m$^2$) using conventional coating equipment. The coatings were allowed to dry at room temperature for at 24 hours. Two strips of each coating type were overcoated with Inverse Emulsion 2, which was directly applied to provide a dry coverage of 100 mg/ft$^2$ (1.08 g/m$^2$) using the same coating equipment. The resulting imaging members were allowed to dry for 24 hours at ambient conditions. In all cases, easily handled, non-tacky coatings with acceptable coloration and odor were obtained.

TABLE III

| Coating Solution | Thermo-reactive Dispersion # | Thermo-reactive dispersion (g) | IR Dye[1] (g) | Lodyne S-228[2] | PVP/VA Binder[3] | Water |
|---|---|---|---|---|---|---|
| A | 2[4] | 10.87 | 0.087 | 0.017 | 1.200 | 17.83 |
| B | 3 | 5.80 | 0.087 | 0.017 | 1.200 | 22.90 |
| C | 4 | 5.80 | 0.087 | 0.017 | 1.200 | 22.90 |

[1]See Dye structure below
[2]Fluorosurfactant manufactured by Ciba Chemical, Tarrytown, NY.
[3]PVP/VA S-630 is a S-630 is poly(vinylpyrrolidone-co-vinylacetate) available from ISP
[4]Purified by dialysis. Final % solids = 8.0%

Dye structure:

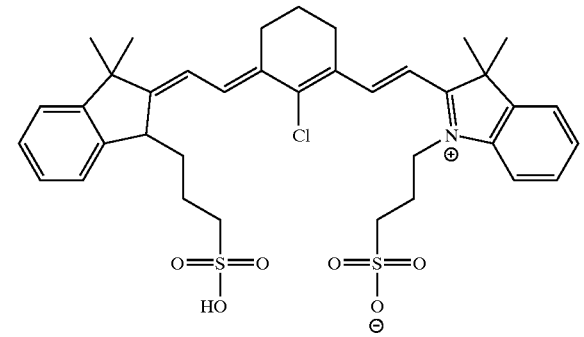

One of each coated and uncoated imaging member was sealed in a padded, plastic-lined mailing envelope and shipped to a second location where it was opened 24 hours later. For the uncoated imaging members, a noticeable odor was evident upon opening of the envelopes. For the overcoated plates, the odor was substantially lessened for those prepared using coating solutions A and B.

The overcoated and non-overcoated imaging members were thermally imaged using a commercially available Creo Trendsetter 3244 imaging device to form printing plates. Each printing plate was patterned with three vertical stripes representing a range of net exposures (307, 451, and 615 mJ/cm$^2$). The plates were then mounted on an A.B. Dick duplicator press as pairs of corresponding overcoated and non-overcoated plates and n to 1000 impressions. In each case, the corresponding overcoated and non-overcoated pairs reached comparable printing densities by 25–50 impressions and printed with acceptable quality to 1000 impressions.

The imaged overcoated and non-overcoated printing plates were examined in both the exposed and unexposed areas by scanning electron microscopy at magnifications up to 50,000×. In all cases, the overcoated plates appeared as contiguous, uninterrupted areas separated with some 5–20 μm cracks. The appearance was nearly identical whether the micrograph was sampled in an imaged or non-imaged area. No obvious surface disturbances indicative of ablation or material loss were observed. The results are summarized in TABLE IV below.

TABLE IV

| Coating | Description | Non-imaged Appearance | Imaged Appearance |
|---|---|---|---|
| A | Reactive dispersion A | Coating of ~50 nm particles | Contiguous coating |
| A-OC | Reactive dispersion A with inverse emulsion overcoat | Slightly "grainy" contiguous coating | Slightly "grainy" contiguous coating |
| B | Reactive dispersion B | Coating of ~60 nm particles | Contiguous coating some containing "compacted" individual particles |
| B-OC | Reactive dispersion A with inverse emulsion overcoat | Sightly "grainy" contiguous coating | Slightly "grainy" contiguous coating |
| C | Reactive dispersion A | Coating of ~60 nm particles | Contiguous coating |
| C-OC | Reactive dispersion A with inverse emulsion overcoat | Slightly "grainy" contiguous coating | Slightly "grainy" contiguous coating |

WORKING EXAMPLE 5

Photothermotraghic Material With Microgel Overcoat

Materials A to G used in the following example are readily available from standard commercial sources or prepared using known procedures and starting materials unless otherwise specified. All percentages are by weight unless otherwise indicated.

A] Infrared Spectral Sensitizing IR Dye 16 is

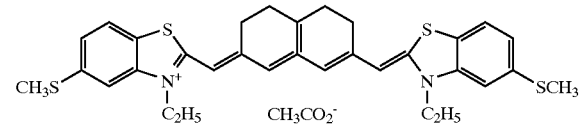

IR Dye 16

B] Dye deaggregate (Deag-1) is 2,2'-(1,2-ethenediyl)bis (5((4-chloro-$^6$-((2 -chlorophenyl)amino)-1,3,5-triazin-2-yl)amino)benzenesulphonic acid, disodium salt, and had the following structure:

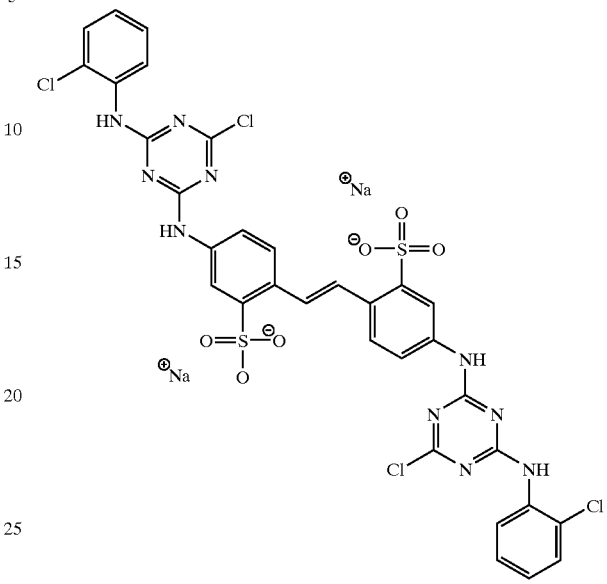

C] Antifoggant AF-1 is 2,2'-dibromo-(4-methylphenyl) sulfonyl-N-(2-sulfoethyl)acetamide, potassium salt and can be prepared as described in U.S. Pat. No. 6,514,678 (Burgmaier et al.) where it is identified as "Antifoggant A-1", incorporated herein by reference.

D] Antifoggant AF-2 is 2-bromo-2-4-methylphenylsulfonyl)-acetamide, can be obtained using the teaching provided in U.S. Pat. No. 3,955,982 (Van Allan).

E] Reducing agent (developer) DEV-1 is 2,2'-3,5,5-trimethylhexylidene)bis(4,6-dimethyl-phenol).

F] Nanoparticulate silver Behenate: A reactor was initially charged with demineralized water, a 10% solution of dodecylthiopolyacrylamide surfactant (72 g), and bchenic acid [46.6 g, nominally 90% behenic acid (Unichema) recrystallized from isopropanol]. The reactor contents were stirred at 150 rpm and heated to 70° C. at which time a 10.85% w/w KOH solution (65.1 g) were added to the reactor. The reactor contents were then heated to 80° C. and held for 30 minutes until a hazy solution was achieved. The reaction mixture was then cooled to 70° C. and a silver nitrate solution consisting of silver nitrate (166.7g of 12.77% solution) was added to the reactor at a controlled rate during 30 min. The reactor contents were then held at the reaction temperature for 30 minutes, cooled to room temperature, and decanted. A nanoparticulate silver behenate dispersion (NPSBD) with a median particle size of 140 nm was obtained (3% solids).

The 3% solids nanoparticulate silver behenate dispersion (12 kg) was loaded into a diafiltration/ultrafiltration apparatus (with an Osmonics model 21-HZ20-S8J permeator membrane cartridge having an effective surface area of 0.34 m$^2$ and a nominal molecular weight cutoff of 50,000). The apparatus was operated so that the pressure going into the permeator was 50 lb/in$^2$ (3.5 kg/cm$^2$) and the pressure downstream from the permeator was 20 lb/in$^2$ (1.4 kg/cm$^2$). The permeate was replaced with deionized water until 24 kg of permeate were removed from the dispersion. At this point the replacement water was turned off and the apparatus was run until the dispersion reached a concentration of 28% solids to provide a nanoparticulate silver behenate dispersion (NPSB).

G] Dyed Silver Bromoiodide Imaging Emulsion:

A silver bromoiodide emulsion was prepared using conventional precipitation techniques. The resulting AgBrI emulsion comprised 3 mol % iodide (based on total silver in the silver halide) cubic grains having a mean edge length of 57 nm, and gelatin (20 g/mol silver in the silver halide).

To prepare the dyed emulsion, 2.04 g of the AgBrI emulsion was mixed with 0.56 g of a 10% solution of Olin 10G, surfactant To this was added 1.3 g of a 0.3% dispersion of Deag-1 in water and 0.17 g of a 0.7% solution of IR Dye 1 in methanol.

Preparation of Photothermographic Material

An imaging composition to yield 0.1 kg of liquid mixture was prepared by mixing at 40° C. an aqueous solution of deionized bone gelatin (15.7 g of 35%), water (31.2 g), and the NPSBD (37.0 g) and adjusting to pH 6.5 under PAN lighting. To this were added Antifoggant AF-1 (0.8 g of 2.5% aqueous solution), Antifoggant AF-2 (0.27 g of 20.3% by weight solid-particle dispersion prepared using conventional milling techniques), succinimide (0.8 g), an aqueous solution (10.13 g) of sodium iodide (50 g/l), and a solid-particle dispersion of reducing agent DEV-1 (9.49 g of 20.1% by weight) that had been prepared using conventional milling techniques. After stirring the mixture for 60 minutes, 4.1 g of the dyed AgBrI emulsion were added. After stirring at 40° C. for 60 minutes, 1.11 g of 4-methylphthalic acid (0.9 g of 10% aqueous solution) were then added. This final mixture was stirred at 40° C. until coating.

This formulation was coated onto a clear, gelatin-subbed, 0.178 mm thick poly(ethylene terephthalate) support to give a wet coverage of 99 g/m$^2$ to provide a photothermographic material.

Several 1.5"×10" strips of the photothernographic material were overcoated with Inverse emulsions 3 and 4 at a coverage of 200 mg/ft$^2$ (2.16 g(m$^2$). The overcoated photothermographic elements were non-tacky, had good handleability, and had desired sensitometric properties.

The invention has been described in detail with particular reference to certain preferred embodiments thereof, but it will be understood that variations and modifications can be effected within the spirit and scope of the invention.

We claim:

1. An imaging member comprising a support, and disposed thereon:
   an imaging layer comprising one or more imaging components, which layer has been applied as an aqueous formulation, and
   applied directly over said imaging layer, a protective layer comprising highly hydrophilic, water-swellable microgel particles that have been applied as a non-aqueous inverse emulsion dispersed in a water-immiscible organic solvent.

2. The imaging member of claim 1 that is a photographic material wherein said imaging layer comprises a photographic silver halide emulsion.

3. The imaging member of claim 1 that is a thermally developable material wherein said imaging layer is a thermally developable emulsion.

4. The imaging member of claim 3 that is a photothermographic material wherein said imaging layer is a photothermographic emulsion.

5. The imaging member of claim 1 that is a lithographic printing plate precursor wherein said imaging layer is a lithographic imaging layer.

6. The imaging member of claim 5 wherein said lithographic imaging layer comprises a heat-sensitive ionomer.

7. The imaging member of claim 1 wherein said imaging layer further comprises a photothermal conversion material.

8. The imaging member of claim 1 wherein said water-swellable microgel particles are crosslinked and have a diameter of from about 0.02 to about 5 µm.

9. The imaging member of claim 1 wherein said water-swellable microgel particles comprise recurring units derived from one or more of acrylamide, methacrylamide, acrylic acid and salts thereof, methacrylic acid and salts thereof, methylenebisacrylamide, hydroxyethyl acrylate, PEG diacrylate, PEG dimethacrylate.

10. A lithographic imaging member comprising a support, and disposed thereon:
    a lithographic imaging layer that has been applied as an aqueous formulation, and
    applied directly over said imaging layer, a protective layer comprising highly hydrophilic, water-swellable microgel particles that have been applied as a non-aqueous inverse emulsion dispersed in a water-immiscible organic solvent.

11. The lithographic imaging member of claim 10 wherein said support is a polyester or aluminum support, or said support is an on-press cylinder.

12. The lithographic imaging member of claim 10 wherein said lithographic imaging layer is an ablatable layer.

13. The lithographic imaging member of claim 10 wherein said lithographic imaging layer comprises a heat-sensitive ionomer and a photothermal conversion material.

14. The lithographic imaging member of claim 13 wherein said lithographic imaging formulation comprises a heat-sensitive ionomer that ionomer that contains repetitive quaternary ammonium carboxylate groups.

15. The lithographic imaging member of claim 10 wherein said lithographic imaging layer comprises thermally sensitive combustible particles.

16. The lithographic imaging member of claim 10 wherein said lithographic imaging layer comprises a heat-sensitive cyanoacrylate polymer.

17. The lithographic imaging member of claim 10 wherein said lithographic imaging layer comprises thermomeltable particles.

18. The lithographic imaging member of claim 10 wherein said lithographic imaging layer comprises a polymer that will undergo decarboxylation, desulfonylation, or dephosphonylation when exposed to heat.

19. The lithographic imaging member of claim 10 wherein said lithographic imaging layer comprises a photothermal conversion material.

20. The lithographic imaging member of claim 10 wherein said microgel particles are crosslinked and have a diameter of from about 0.03 to about 1 µm.

21. The lithographic imaging member of claim 10 wherein said microgel particles are composed of one or more of acrylic acid or salt thereof, methacrylic acid or salt thereof, acrylamide, methacrylamide, poly(ethylene glycol acrylate), poly(ethylene glycol methacrylate), N-vinylpyrrolidone, and hydroxyethyl acrylate as well as one or more of methylenebisacrylamide, poly(ethylene glycol diacrylate), and poly(ethylene glycol dimethacrylate).

22. A method of imaging comprising:
   A) providing the lithographic imaging member of claim 10, and
   B) imagewise exposing said lithographic imaging member to thermal energy to provide exposed and unexposed areas in said lithographic imaging layer to provide a lithographic printing plate.

23. The method of claim 22 wherein said imagewise exposing is carried out using a thermoresistive head.

24. The method of claim 22 wherein said lithographic imaging member further comprises a photothermal conversion material, and said imagewise exposing is carried out using an infrared radiation emitting laser.

25. A method of printing comprising:
A) providing the lithographic imaging member of claim 10,
B) imagewise exposing said lithographic imaging member to thermal energy to provide exposed and unexposed areas in said imaging layer to provide a lithographic printing plate, and
C) in the presence of water or a fountain solution, contacting said lithographic printing plate with a lithographic printing ink, and imagewise transferring said lithographic printing ink to a receiving material.

26. The method of claim 25 carried out without alkaline development of said lithographic printing plate.

* * * * *